United States Patent [19]

Hamzehdoost et al.

[11] Patent Number: 5,689,091

[45] Date of Patent: Nov. 18, 1997

[54] MULTI-LAYER SUBSTRATE STRUCTURE

[75] Inventors: Ahmad Hamzehdoost, Sacramento; Kamran Manteghi, Manteca, both of Calif.

[73] Assignee: VLSI Technology, Inc., San Jose, Calif.

[21] Appl. No.: 715,806

[22] Filed: Sep. 19, 1996

[51] Int. Cl.$^6$ ............... H05K 1/18; H05K 3/32
[52] U.S. Cl. ............ 174/255; 174/260; 174/266; 361/761; 361/764; 361/809; 257/698; 257/700; 29/846; 29/852
[58] Field of Search ............ 174/262, 263, 174/264, 265, 266, 255, 260, 261; 361/761, 762, 764, 765, 760, 812, 820, 807, 809; 257/678, 697, 700, 698; 29/846, 852, 830, 840

[56] References Cited

U.S. PATENT DOCUMENTS

| | | | |
|---|---|---|---|
| 4,170,819 | 10/1979 | Peter et al. | 174/262 X |
| 4,211,603 | 7/1980 | Reed | 29/852 X |
| 5,319,159 | 6/1994 | Watanabe et al. | 174/262 |
| 5,487,218 | 1/1996 | Bhatt et al. | 39/852 |
| 5,557,503 | 9/1996 | Banerjee et al. | 174/261 X |

Primary Examiner—Hyung S. Sough
Assistant Examiner—Paramita Ghosh
Attorney, Agent, or Firm—Patrick T. King

[57] ABSTRACT

A multi-layer substrate structure and a method for fabricating the same are provided. Thin metal foils are laminated on the top and bottom sides of a non-conductive layer so as to form a laminated substrate. A plurality of plated-through holes are formed in the laminated substrate and are then filled with an epoxy. The laminated substrate is then patterned and etched. Epoxy layers are disposed on both sides of the laminated substrate. The laminated substrate is formed with a plurality of smaller plated-through holes extending through the epoxy layers and with a cavity to receive an integrated-circuit die. The through holes and the epoxy layers are metallized on both sides of the laminated substrate. The laminated substrate is patterned and etched again. A solder mask is applied on both sides of the laminated substrate so as to form selective wire bondable areas and selective solderable areas. The integrated circuit die is disposed in the center of the cavity and has a plurality of bonding pads. A plurality of bonding wires are connected between corresponding selective wire bondable areas on the laminated substrate and associated bonding pads on the die. The integrated circuit die and plurality of bonding wires are encapsulated with a plastic molding material. Finally, a plurality of solder balls are attached to the selective solderable areas.

22 Claims, 5 Drawing Sheets

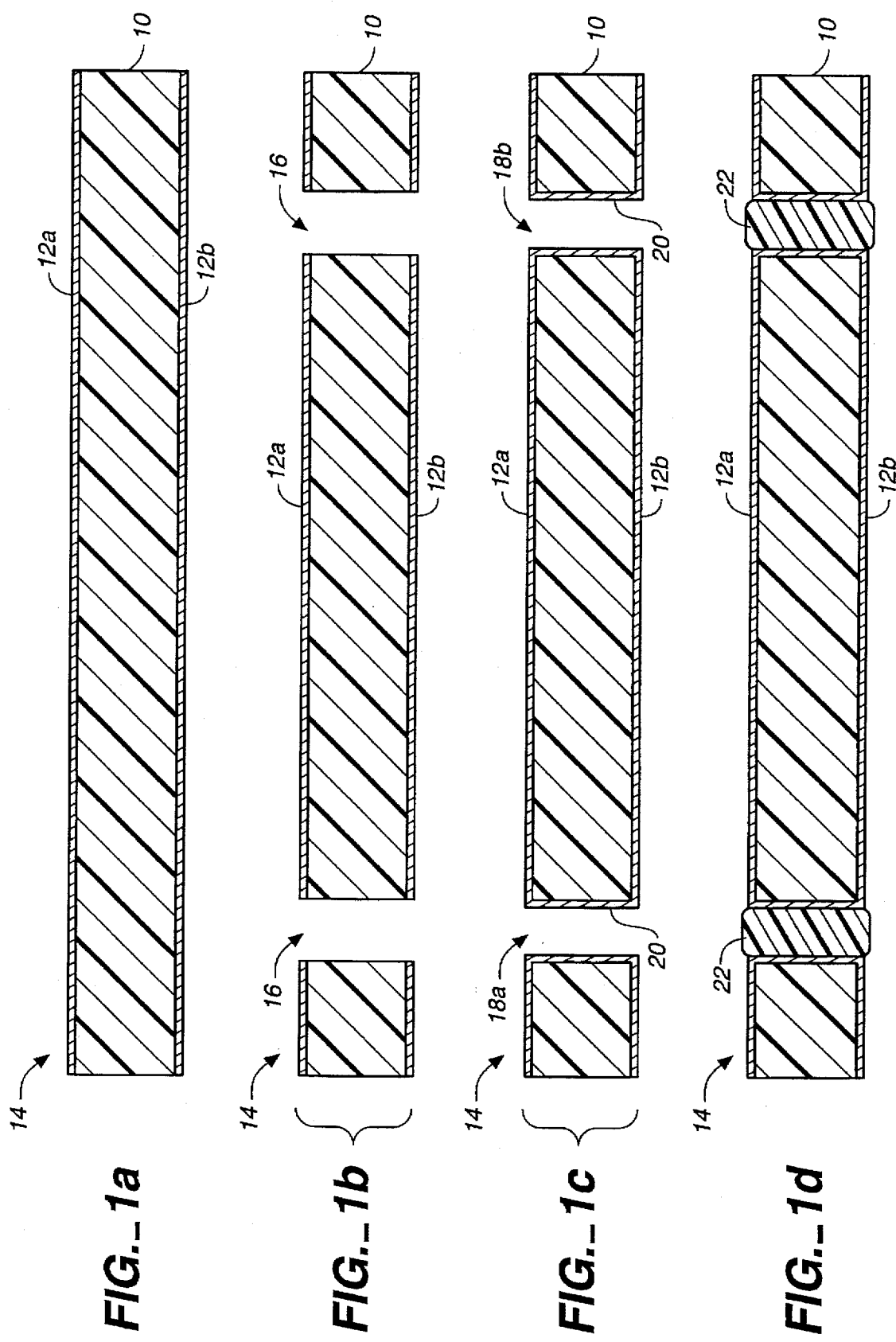

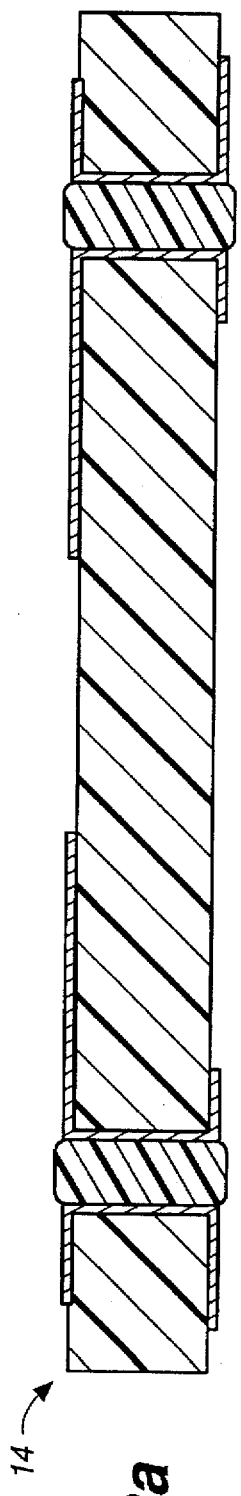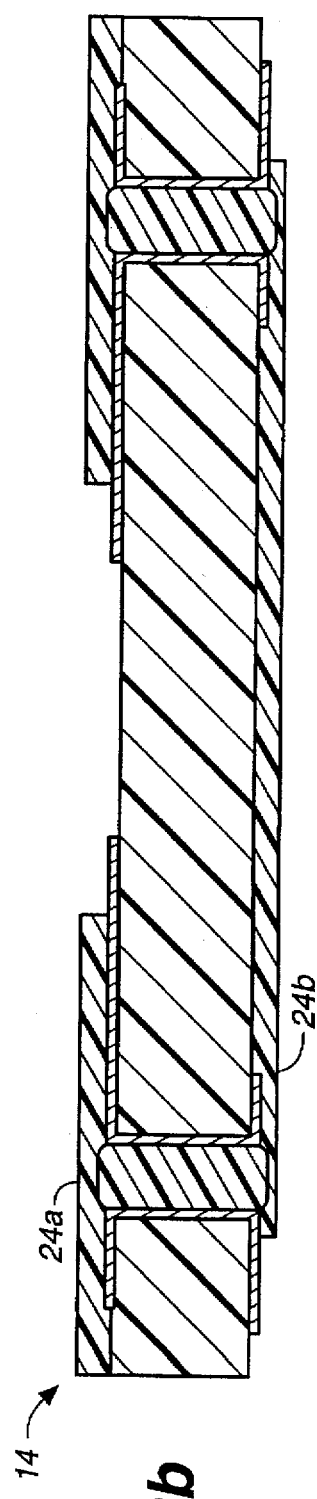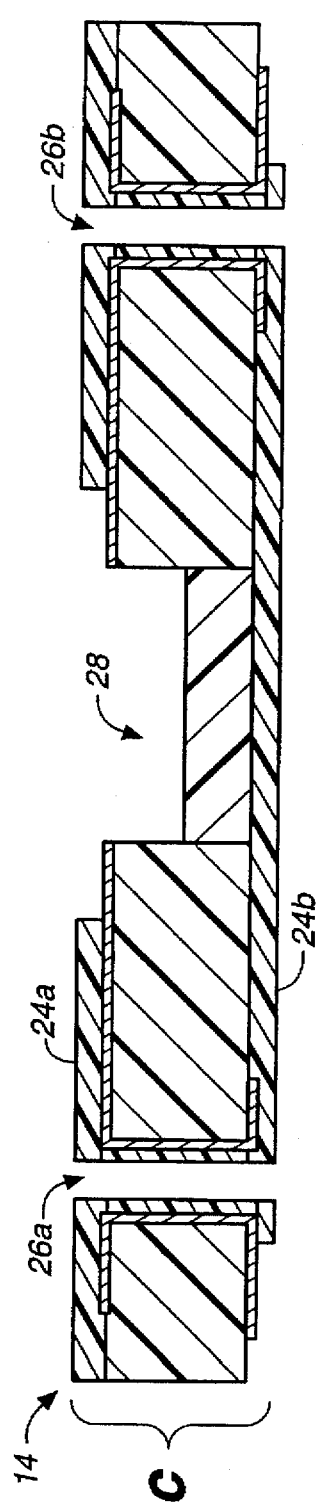
FIG._2a  FIG._2b  FIG._2c

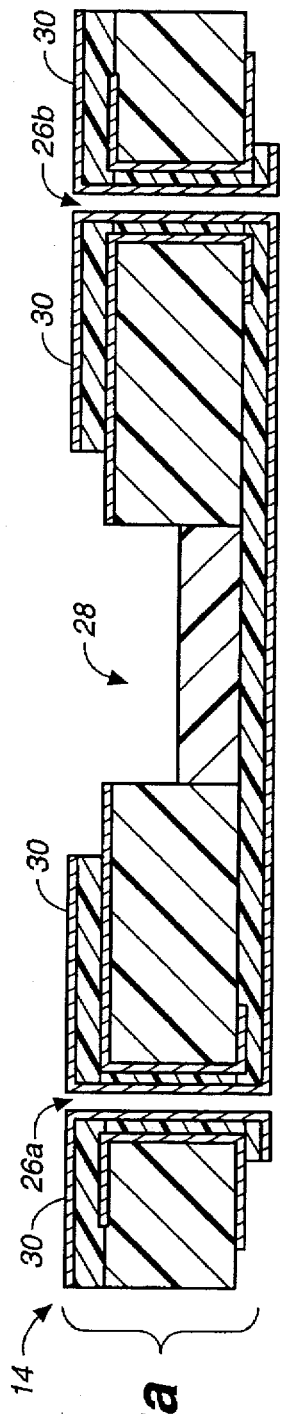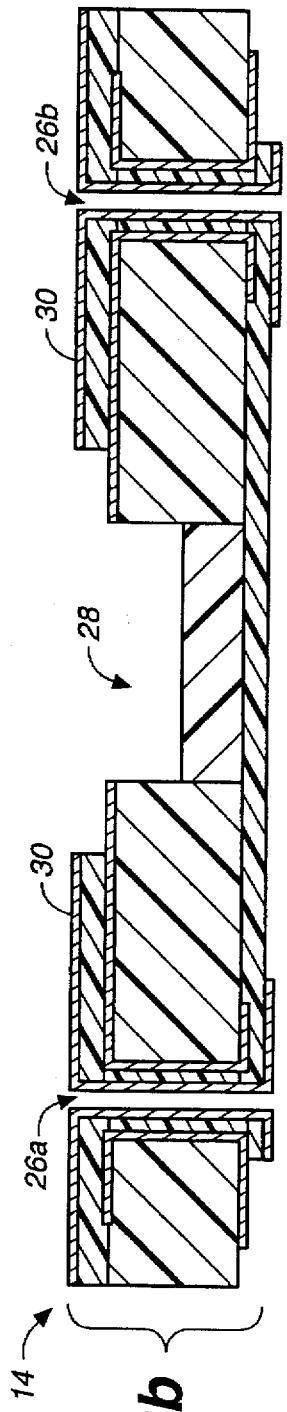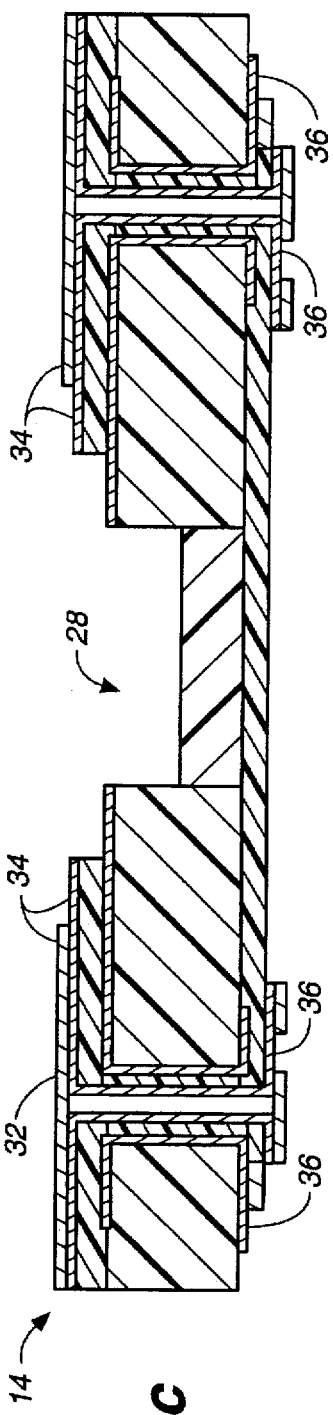
FIG._3a   FIG._3b   FIG._3c

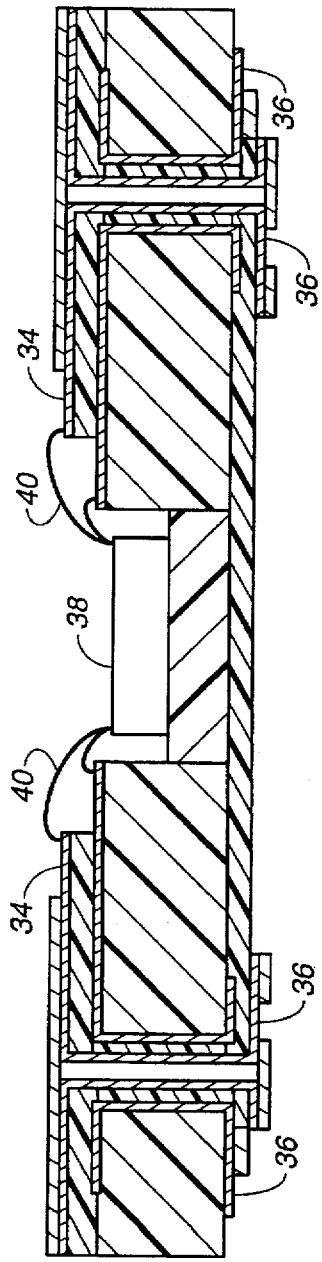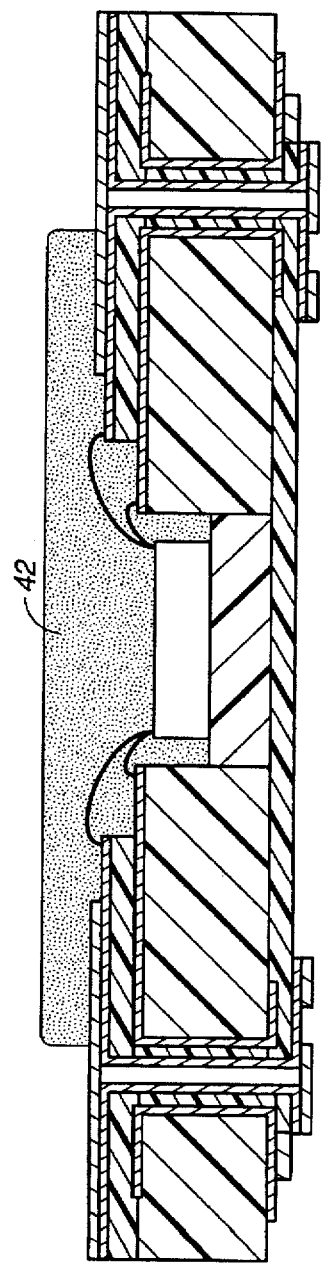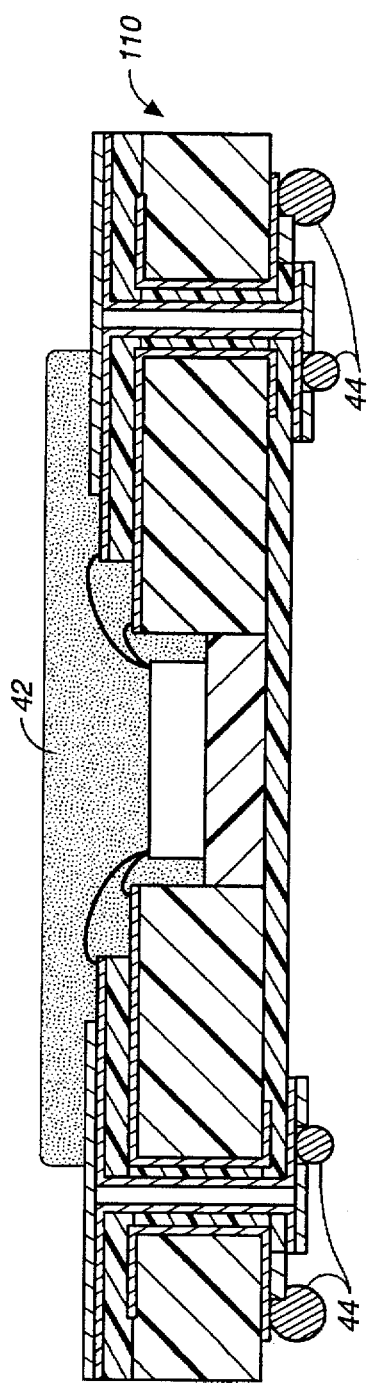

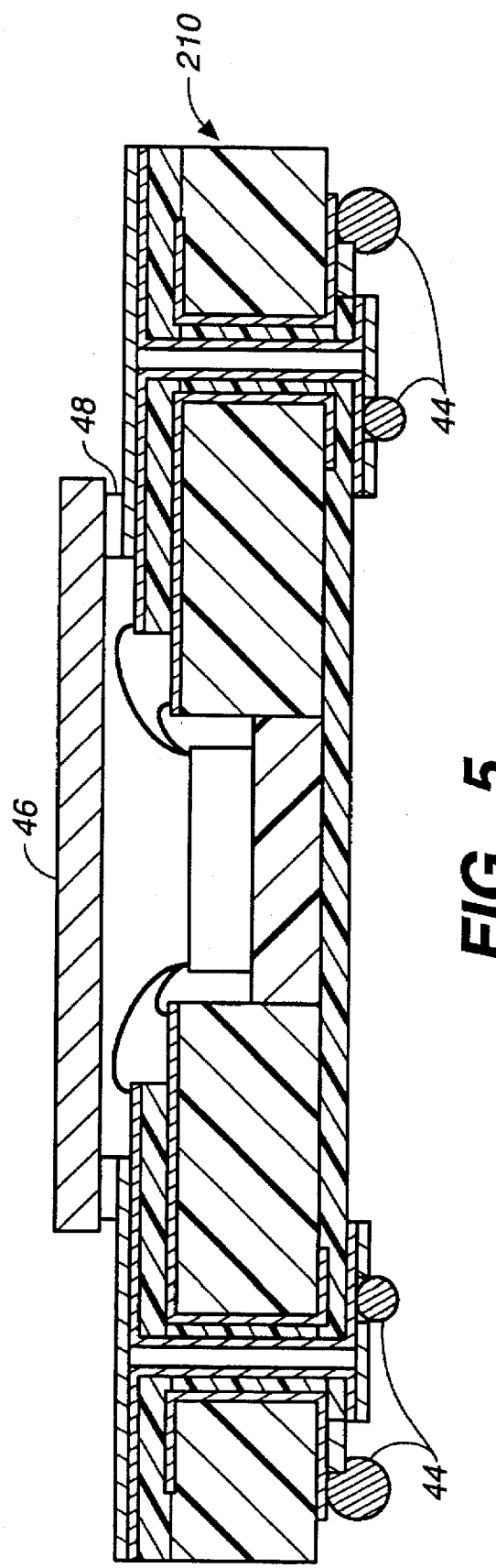
FIG._5

MULTI-LAYER SUBSTRATE STRUCTURE

BACKGROUND OF THE INVENTION

This invention relates generally to integrated circuit package assemblies and more particularly, it relates to an integrated circuit chip package having an improved multi-layer substrate structure.

As is generally known in the art of integrated circuit packaging, an integrated circuit is formed on a small, substantially planar, piece of semiconductor such as silicon, known as a chip or die and is typically mounted in a cavity formed on a mounting substrate. The mounting substrate may be in the form of a printed circuit board having a plurality of conductive traces disposed internally therein. The die generally contains a number of circuits therein and includes a plurality of bonding pads disposed on its top surface adjacent its peripheral edges. Very thin gold bonding-wires have their one ends bonded to the corresponding pads on the integrated-circuit die and their other ends bonded to the corresponding ends of the conductive traces. The conductive traces are electrically connected to respective pins located in the printed circuit board and extending through respective plated-through holes formed therein. A lid is used to protect and hermetically seal the integrated-circuit die within the cavity in the printed circuit board.

As the number of pins in the printed circuit board increases due to higher die densities and larger die sizes, the amount of real estate occupied by the substrate will increase correspondingly. Due to the increased trend for higher die densities and larger die sizes, there has been placed a demand on packaging designers to move toward utilizing multi-layer substrates. However, since the use of increased number of substrates is generally more expensive, this has caused increased manufacturing costs. Further, as the number of pins increases there is also an increase in the number of plated-through holes required, thereby increasing the size of the substrate real estate.

Accordingly, it would be desirable to provide an improved multi-layer substrate structure which reduces the number of substrate layers used as well as the overall size of the substrate real estate in printed circuit board assemblies, thereby resulting in lower manufacturing costs. It would also be expedient to provide a multi-layer substrate structure which permits bond wires to be directly attached thereto so as to eliminate and reduce the requirement for longer metal conductive traces or lead frames.

SUMMARY OF THE INVENTION

Accordingly, it is a general object of the present invention to provide an integrated circuit chip package having an improved multi-layer substrate structure which is relatively simple in its construction and is easy to manufacture and assemble.

It is an object of the present invention to provide an improved multi-layer substrate structure which reduces the number of substrate layers used as well as the overall size of the substrate real estate in printed circuit board assemblies.

It is another object of the present invention to provide an improved multi-layer substrate which permits bond wires to be attached directly thereto so as to eliminate and reduce the requirement for longer metal conductive traces or lead frames.

It is still another object of the present invention to provide a method for fabricating a multi-layer substrate structure of a simple construction, thereby reducing manufacturing costs.

In accordance with these aims and objectives, the present invention is concerned with the provision of an improved multi-layer substrate structure and a method for fabricating the same. A first thin metal foil is laminated on the top side of a non-conductive layer. A second thin metal foil is laminated on the bottom side of the non-conductive layer. The non-conductive layer is sandwiched between the first and second metal foils so as to form a laminated substrate. The laminated substrate is formed with a plurality of plated-through holes which are filled with an epoxy. The laminated substrate is then patterned and etched. Epoxy layers are disposed on both sides of the laminated substrate.

Then the epoxy filled plated through holes are drilled with smaller holes. The smaller holes and the new epoxy layers are now metallized and patterned with a cavity for receiving an integrated-circuit die. The laminated substrate is patterned and etched again. A solder mask is applied to both sides of the laminated substrate so as to form selective wire bondable areas and selective solderable areas. The integrated-circuit die is disposed in the center of the cavity and has a plurality of bonding pads. A plurality of bonding wires are connected between corresponding selective wire bondable areas on the laminated substrate and associated bonding pads on the die. The integrated-circuit die and the plurality of bonding wires are encapsulated with a plastic encapsulation material or a lid. Finally, a plurality of solder balls are attached to the selected solderable areas.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 1(a) through 1(d) show the beginning steps for producing a multilayer substrate structure of FIG. 4, constructed in accordance with the principles of the present invention;

FIGS. 2(a) through 2(c) show subsequent intermediate stages for producing the multi-layer substrate of FIG. 4;

FIGS. 3(a) through 3(e) show further subsequent intermediate stages for producing the multi-layer substrate structure of FIG. 4;

FIG. 4 is a cross-sectional view of the multi-layer substrate structure produced in accordance with the teachings of the invention; and FIG. 5 is a cross-sectional view of a second embodiment of the multi-layer substrate structure of the present invention.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. FIGS. 1(a)–1(d) illustrate the initial steps for producing an integrated circuit chip package 110 of FIG. 4 having an improved multi-layer substrate structure of the present invention. FIGS. 2(a)–2(c) show the subsequent and intermediate steps for producing the integrated circuit chip package 110. FIGS. 3(a)–3(e) depict the further subsequent and intermediate steps for producing the integrated circuit chip package 110. FIG. 4 is a cross-sectional view of the improved integrated circuit chip package 110 produced in accordance with the steps taught in FIGS. 1 through 3. FIG. 5 illustrates a second embodiment of the integrated circuit chip package 210 which is substantially identical to FIG. 4, except that the encapsulation is replaced with a lid.

With particular reference to FIGS. 1(a)–1(c), a non-conductive, hermetic material 10 functioning as an insulator is provided and may be comprised of either ceramic, molded plastic, polyimide, FR-4 glass-epoxy, or other suitable material. The non-conductive material 10 is preferably formed of a layer of epoxy which is then laminated on both its top and bottom sides with thin sheets 12a and 12b of metal foil. The metal foils are preferably formed of copper or other similar highly conductive material. This is depicted in FIG. 1(a) as a copper laminated substrate 14.

Next, holes 16 are readily formed in the copper laminate substrate 14 extending through the epoxy 10 from the metal foil 12a to the metal foil 12b by conventional drilling techniques, e.g., conventional mechanical or laser drilling techniques, as illustrated in FIG. 1(b). Thereafter, conductive vias 18a and 18b are formed as plated-through holes in the laminated substrate 14 by means of depositing a conductive metal 20 such as copper. This is depicted in FIG. 1(c). Then, the conductive vias 18a, 18b are filled with an epoxy 22 which is shown in FIG. 1(b).

Now with reference with FIGS. 2(a)–2(c), the laminated substrate 14 is patterned and etched as is desired which is shown in FIG. 2(a). Next, layers 24a and 24b of epoxy are applied on the respective top and bottom sides of the laminated substrate 14 and are subsequently cured, which is shown in FIG. 2(b). The epoxy-filled conductive vias are then re-drilled so as to form holes 26a and 26b of a smaller diameter within the epoxy-filled plated-through holes. At the same time, a cavity 28 is routed in the center of the laminated substrate 14 to receive an integrated-circuit die.

The smaller diameter holes 26a, 26b and new epoxy layers 24a, 24b are now plated with a conductive metal layer 30. This new conductive metal layer 30 is then patterned and etched as is desired. These steps are illustrated in FIGS. 3(a) and 3(b). Next, a solder mask 32 is applied, preferably using a screen printing or photo imaging procedure known in the art. During such procedure, the entire exposed surfaces of the conductive metal layer 30 is covered with a compatible material, except for selective wire bondable areas 34 and for selective solderable areas 36 where it is desired to have the solder balls applied, and is subsequently cured. This step is shown in FIG. 3(c).

A semiconductor integrated circuit die 38 is connected to the central region of the cavity 28. Then, very thin gold bonding wires 40 have their one ends bonded to corresponding bonding pads (not shown) on the integrated-circuit die 38 and their other ends bonded to the associated selective wire bondable areas 34. This is illustrated in FIG. 3(d). After the die bonding process, the die 38 and bonding wires 40 are encapsulated with a plastic molding material 42 as shown in FIG. 3(e).

Finally, a plurality of solder balls 44 are attached to the selective solderable areas 36 in order to form the completed integrated circuit chip package 110 shown in FIG. 4. The solder balls 44 are finished with eutectic solder bumps, preferably 63% tin (Sn) and 37% lead (Pb) so as to reflow during a next assembly process for surface mounting the solder balls 44 to both the integrated circuit chip package 110 and to the next-level board (i.e., motherboard). One technique suitable for mounting the solder balls 44 to the selective solderable areas is the so-called C-4 (controlled collapse chip connection) technology.

Alternatively, instead of the encapsulation process of FIG. 3(e), a non-conductive lid 46 is provided to protect and hermetically seal the integrated-circuit die within the cavity in the laminated structure. The non-conductive lid 46 is typically formed of a ceramic or plastic material. The lid is attached and sealed around its peripheral edges to the solder mask via a layer 48 of conductive eutectic sealing material.

Unlike the prior art, the integrated circuit chip package having the multi-layer substrate structure of the present invention has eliminated and reduced the requirements for longer metal conductive traces or lead frames. As a result, the present technique for fabricating the multi-layer substrate structure is less expensive.

From the foregoing detailed description, it can thus be seen that the present invention provides an integrated circuit chip package having an improved multi-layer substrate structure and a method for fabricating the same which is of a relatively simple construction and is low-cost to manufacture and assemble.

What is claimed is:

1. A multi-layer substrate structure comprising:

a non-conductive layer having top and bottom sides;

a first thin metal foil being laminated on the top side of said non-conductive layer;

a second thin metal foil being laminated on the bottom side of said non-conductive layer, said non-conductive layer being sandwiched between said first and second metal foils so as to form a laminated substrate;

said laminated substrate being formed with a plurality of plated-through holes which are filled with an epoxy;

said laminated substrate being patterned and etched;

epoxy layers being disposed on both sides of the laminated substrate;

said laminated substrate being formed with a plurality of smaller through holes extending through said epoxy layers and said epoxy filled through holes, and with a cavity to receive an integrated-circuit die;

said laminated substrate and the through holes being metallized with a conductive layer;

said laminated substrate being patterned and etched again;

a solder mask being applied on both sides of the laminated substrate so as to form selective wire bondable areas and selective solderable areas;

an integrated-circuit die being disposed in the center of said cavity and having a plurality of bonding pads;

a plurality of bonding wires connected between corresponding selective wire bondable areas on said laminated substrate and associated bonding pads on said die;

said integrated-circuit die and said plurality of bonding wires being encapsulated with a plastic molding material; and a plurality of solder balls being attached to the selective solderable areas.

2. A multi-layer substrate structure as claimed in claim 1, wherein said non-conductive layer is formed of an epoxy material.

3. A multi-layer substrate structure as claimed in claim 1, wherein said first and second metal foils are formed of copper.

4. A multi-layer substrate structure as claimed in claim 1, wherein said plurality of plated-through holes are formed by laser drilling and then plated with a conductive metal material.

5. A multi-layer substrate structure as claimed in claim 4, wherein said conductive metal material is copper.

6. A multi-layer substrate structure as claimed in claim 1, wherein said solder mask is applied by a screen printing process.

7. A multi-layer substrate structure as claimed in claim 1, wherein said solder balls are comprised of eutectic solder bumps.

8. A multi-layer substrate structure as claimed in claim 7, wherein said solder bumps are comprised of 63% Sn and 37% Pb.

9. A multi-layer substrate structure comprising:

a non-conductive layer having top and bottom sides;

a first thin metal foil being laminated on the top side of said non-conductive layer;

a second thin metal foil being laminated on the bottom side of said non-conductive layer, said non-conductive layer being sandwiched between said first and second metal foils so as to form a laminated substrate;

said laminated substrate being formed with a plurality of plated-through holes which are filled with an epoxy;

said laminated substrate being patterned and etched;

epoxy layers being disposed on both sides of the laminated substrate;

said laminated substrate being formed with a plurality of smaller through holes extending through said epoxy layers and said epoxy filled through holes, and with a cavity to receive an integrated-circuit die;

said laminated substrate being metallized in the through holes and on the disposed epoxy layers on both sides of the laminated substrate;

said laminated substrate being patterned and etched again;

a solder mask being applied on both sides of the laminated substrate so as to form selective wire bondable areas and selective solderable areas;

an integrated-circuit die being disposed in the center of said cavity and having a plurality of bonding pads;

a plurality of bonding wires connected between corresponding selective wire bondable areas on said laminated substrate and associated bonding pads on said die;

a non-conductive lid being disposed on said laminated substrate so as to overlie said integrated-circuit die and said plurality of bonding wires; and a plurality of solder balls being attached to the selective solderable areas.

10. A multi-layer substrate structure as claimed in claim 9, wherein said non-conductive layer is formed of an epoxy material.

11. A multi-layer substrate structure as claimed in claim 9, wherein said first and second metal foils are formed of copper.

12. A multi-layer substrate structure as claimed in claim 9, wherein said plurality of plated-through holes are formed by laser drilling and then plated with a conductive metal material.

13. A multi-layer substrate structure as claimed in claim 12, wherein said conductive metal material is copper.

14. A multi-layer substrate structure as claimed in claim 9, wherein said solder mask is applied by a screen printing process.

15. A multi-layer substrate structure as claimed in claim 9, wherein said solder mask is applied by a photoimaging process.

16. A multi-layer substrate structure as claimed in claim 9, wherein said solder balls are comprised of eutectic solder bumps.

17. A multi-layer substrate structure as claimed in claim 16, wherein said solder bumps are comprised of 63% Sn and 37% Pb.

18. A method for fabricating a multi-layer substrate structure comprising the steps of:

laminating top and bottom sides of a non-conductive layer with a thin metal foil so as to form a laminated substrate;

forming a plurality of plated-through holes in the laminated substrate and then filling the same with an epoxy;

patterning and etching the laminated substrate;

applying an epoxy layer on both sides of the laminated substrate;

forming a plurality of smaller through holes in the laminated substrate extending through the epoxy layers and said epoxy filled through holes;

applying a conductive layer in the through holes and on the epoxy layer on both sides of the laminated substrate;

forming a cavity in said laminated substrate so as to receive an integrated-circuit die;

patterning and etching again the laminated substrate;

applying a solder mask on both sides of the laminated structure so as to form selective wire bondable areas and selective solderable areas;

attaching an integrated-circuit die having a plurality of bonding pads in the center of the cavity;

connecting a plurality of bonding wires between corresponding selective wire bondable areas on the laminated substrate and associated bonding pads on the die;

encapsulating the integrated-circuit die and the plurality of bonding wires with a plastic molding material; and attaching a plurality of solder balls to the selective solderable areas.

19. A method for fabricating a multi-layer substrate structure as claimed in claim 18, wherein said solder mask is applied by a screen printing process.

20. A method for fabricating a multi-layer substrate structure as claimed in claim 18, wherein said solder mask is applied by a photo imaging process.

21. A method for fabricating a multi-layer substrate structure as claimed in claim 18, wherein said solder balls are comprised of eutectic solder bumps.

22. A method for fabricating a multi-layer substrate structure as claimed in claim 21, wherein said solder bumps are comprised of 63% Sn and 37% Pb.

* * * * *